(12) United States Patent
Koyama

(10) Patent No.: US 6,728,110 B2
(45) Date of Patent: Apr. 27, 2004

(54) VEHICULAR ELECTRONIC DEVICE

(75) Inventor: Takeshi Koyama, Kobe (JP)

(73) Assignee: Fujitsu Ten Limited, Kobe (JP)

( * ) Notice: Subject to any disclaimer, the term of this patent is extended or adjusted under 35 U.S.C. 154(b) by 72 days.

(21) Appl. No.: 10/120,540

(22) Filed: Apr. 12, 2002

(65) Prior Publication Data

US 2002/0149918 A1 Oct. 17, 2002

(30) Foreign Application Priority Data

Apr. 12, 2001 (JP) ........................................ 2001-114148

(51) Int. Cl.[7] .................................................. H05K 5/00
(52) U.S. Cl. ........................................ 361/752; 439/76.1
(58) Field of Search ................................ 361/752, 736, 361/748, 753, 786, 799, 801; 439/79, 76.1, 607, 762, 97

(56) References Cited

U.S. PATENT DOCUMENTS

| | | | | |
|---|---|---|---|---|
| 5,362,243 A | * | 11/1994 | Huss et al. ................ | 439/76.1 |
| 6,188,019 B1 | * | 2/2001 | Baur et al. ................ | 174/51 |
| 6,431,884 B1 | * | 8/2002 | Wallace et al. ............ | 439/86 |
| 6,466,447 B2 | * | 10/2002 | Murowaki et al. .......... | 361/752 |
| 6,493,232 B2 | * | 12/2002 | Skofljanec ................ | 361/752 |

FOREIGN PATENT DOCUMENTS

| | | |
|---|---|---|
| DE | 43 00 342 A1 | 7/1994 |
| GB | 2 349 447 A | 11/2000 |
| JP | 2000-326788 A | 11/2000 |
| TW | B-336595 | 7/1998 |
| WO | WO 00/47451 | 8/2000 |

* cited by examiner

*Primary Examiner*—Michael Sherry
*Assistant Examiner*—Thanh S. Phan
(74) *Attorney, Agent, or Firm*—Oliff & Berridge, PLC

(57) ABSTRACT

In an electronic apparatus having brackets which are formed integrally with a case of the electronic apparatus, and which are used for attaching the case to a vehicle, a thin portion is disposed on the side of the brackets with respect to a partition wall which forms a space for housing a circuit board, and a member which forms the thin portion is thinner than the partition wall.

7 Claims, 5 Drawing Sheets

VEHICULAR ELECTRONIC DEVICE

The present disclosure relates to the subject matter contained in Japanese Patent Application No.2001-114148 filed Apr. 12, 2002, which is incorporated herein by reference in its entirety.

BACKGROUND OF THE INVENTION

1. Field of the Invention

The present invention relates to a vehicular electronic device in which a case that houses a circuit board and a connector, and brackets for attaching the case to a vehicle are formed integrally with each other.

2. Description of the Related Art

A vehicular electronic device according to the related art will be described with reference to the accompanying drawings.

FIGS. 1(a) and 1(b) are views showing a manner of attaching a vehicular electronic device to a frame of a vehicle. The direction of the arrow E indicates the longitudinal direction of the vehicle. In FIG. 1, (a) is a plan view, and (b) is a view looking in the direction of the arrow E. FIG. 6 is an exploded perspective view of a conventional vehicular electronic device. FIG. 7 is a section view of the conventional vehicular electronic device, taken along the line B—B of FIG. 6. FIG. 8 is a view showing a state where the conventional vehicular electronic device is broken by an impact load.

The vehicular electronic device is configured by a case 91 made of an aluminum die casting, a printed circuit board 2, a lid 3, and a connector 4.

As shown in FIG. 1, the vehicular electronic device is attached to a frame 80 of the floor of a vehicle.

The case 91 is made of a light aluminum die casting which has a function of electromagnetically shielding the printed circuit board 2, and which prevents the main unit of the electronic apparatus from being damaged in a collision of the vehicle. A space for housing the printed circuit board 2 and the like is formed inside the case 91. A cutaway 121 through which the connector 4 is to be passed is formed in one of four side walls 12. Three brackets 15 for attaching the vehicular electronic device to the frame 80 of the vehicle are extended from the outer faces of the side walls 12 of the case 91. Each of the brackets 15 has an abutting face 17 which is to abut against the frame 80 of the vehicle, and an attachment hole 16 through which an attachment screw 85 is to be passed.

In the printed circuit board 2, the external shape has dimensions which allow the board to be housed in the space of the case 91, attachment holes 23 are formed respectively in the four corners at the same intervals as those of screw holes 14 of the case 91, and copper patterns are formed on both the faces. An acceleration sensor 21 and another electronic component 22 are mounted on the upper face (on the side of the top plate 5 of the case) of the printed circuit board 2.

The lid 3 is configured by a steel plate. In the lid, the external shape has dimensions which allow the lid to be housed in the space of the case 91, attachment holes 24 through which screws are to be passed are formed respectively in the four corners at the same intervals as those of the screw holes 14 of the case. A rib 31 which is slightly raised is formed on the whole periphery of the lid 3. The lid exerts functions of dustproof and electromagnetic shielding on electronic circuits, and prevents the copper patterns and the components from being damaged by an external force.

The connector 4 is an output terminal through which an ignition command generated by the acceleration sensor 21 or the other electronic component 22 is transmitted to a gas generator of an air bag.

Next, the assembly structure will be described with reference to the accompanying drawings.

FIG. 7 is a section view of the conventional vehicular electronic device, taken along the line B—B of FIG. 6.

The printed circuit board 2 abuts against mounting faces 13 in a state where the face on which the acceleration sensor 21, the other electronic component 22, and the connector 4 are mounted is opposed to the top plate 5. The connector 4 is engaged with the cutaway 121 of the case. An end portion 31a of the rib 31 of the lid 3 abuts against the printed circuit board 2. The case 91, the printed circuit board 2, and the lid 3 are stacked in this sequence and then fastened together by four screws 86.

In the above-described vehicular electronic device, the side walls 12 of the case 91 have a uniform thickness, and the plural brackets 15 are formed integrally on the outer faces of the walls. When the frame 80 is deformed by a collision or the like, therefore, the side walls 12 are sometimes deformed in a region H (see FIG. 8) ranging from the root portion of the top plate 5 to the printed circuit board 2 as shown in FIG. 8. At this time, there is a possibility that the printed circuit board 2 or the components of the vehicular electronic device is damaged (Y of FIG. 8), or that broken pieces 91a of the aluminum die casting due to bending or breakage of the side walls 12 of the case 91 are scattered (X of FIG. 8) and fall on the electronic components or the patterns, thereby causing a short circuit.

The invention has been conducted in order to solve the above-discussed problem. It is an object of the invention to maintain functions of a vehicular electronic device even when an impact is applied to a vehicle and the frame 80 is subjected to deformation such as bending or compression. It may be the functions of the vehicle electronic device to be maintained that the acceleration sensor 21 detects the impact and the other electronic component 22 transmits an ignition command to an air bag.

SUMMARY OF THE INVENTION

In order to attain the object, according to a first aspect of the invention, there is provided a vehicular electronic device having a circuit board, a case, a connector, and a bracket. The circuit board performs a predetermined control in a vehicle. The case houses the circuit board. The connector electrically connects the circuit board with an outside. The bracket is formed integrally with the case and attaches the case to the vehicle. The case has a first portion and a second portion. The first portion is thicker than the second portion. The second portion continuously extends to the bracket.

According to a second aspect of the invention, the first portion defines space in which the circuit board is housed.

According to a third aspect of the invention, when the case is attached to the vehicle, the first portion is thicker than the second portion in a longitudinal direction of the vehicle.

According to a fourth aspect of the invention, the circuit board controls an air bag.

BRIEF DESCRIPTION OF THE DRAWINGS

Exemplary embodiments will be described below with reference to the drawings, in which like reference numerals represent like parts, and wherein.

DETAILED DESCRIPTION OF THE PREFERRED EMBODIMENTS

A vehicular electronic device according to an embodiment of the invention will be described with reference to the accompanying drawings.

Figure 1:
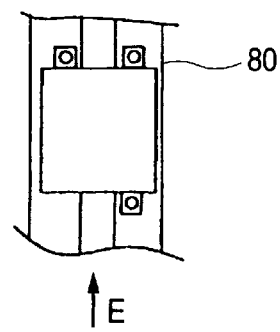
FIG. 1 is a view showing a manner of attaching a vehicular electronic device to a frame of a vehicle.
Figure 1:
Figure 2:
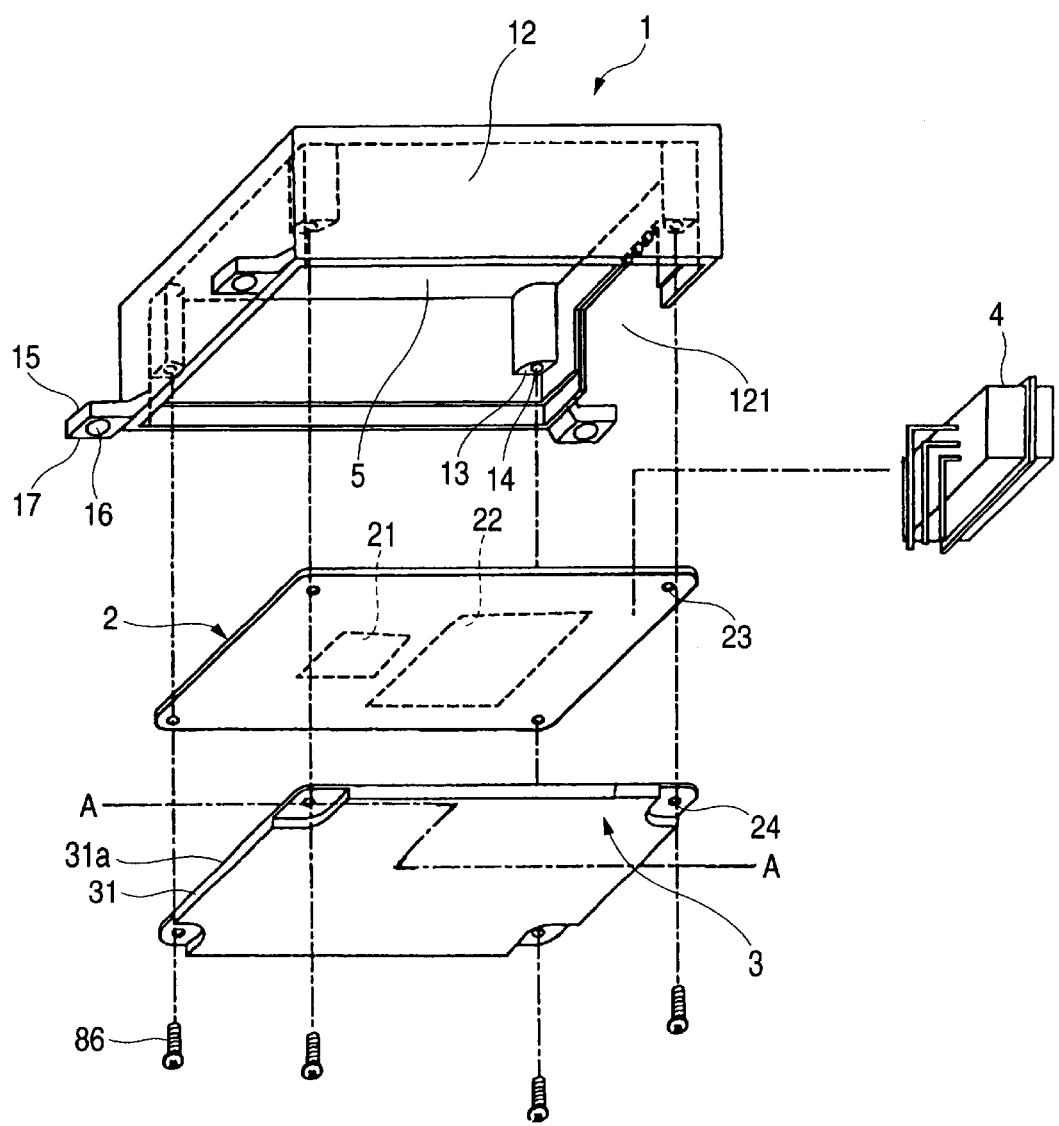
FIG. 2 is an exploded perspective view of the vehicular electronic device of an embodiment of the invention.
Figure 3:
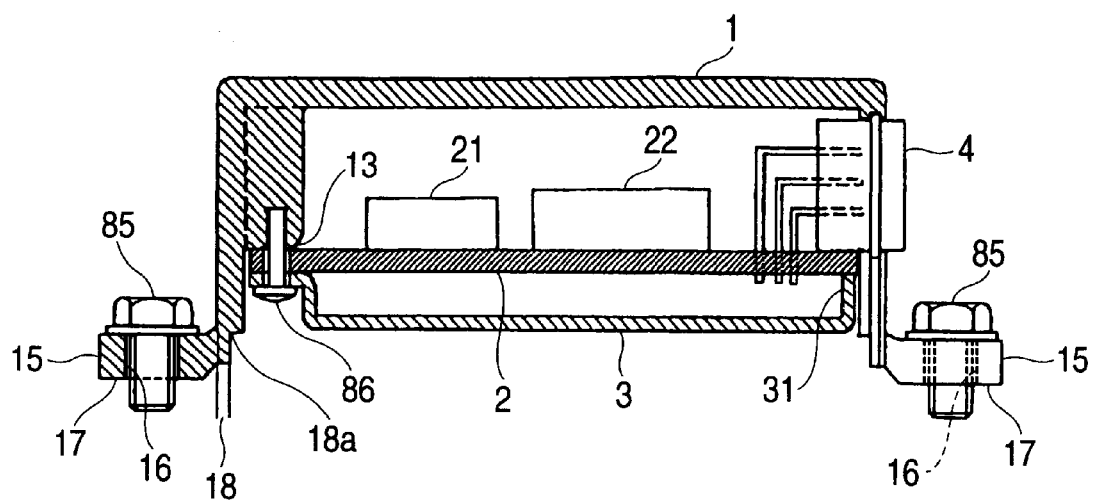
FIG. 3 is a section view of the vehicular electronic device, taken along the line A—A of FIG. 2.

FIG. 1 is a view showing a manner of attaching the vehicular electronic device to a vehicle. FIG. 2 is an exploded perspective view of the vehicular electronic device according to the embodiment of the invention. FIG. 3 is a section view of the vehicular electronic device, taken along the line A—A of FIG. 2.

The vehicular electronic device has a case 1, a printed circuit board 2 on which an acceleration sensor 21 and another electronic component 22 are mounted, a lid 3, and a connector 4.

The case 1 has a box-like structure made of a light and economical aluminum die casting which has a function of electromagnetically shielding the printed circuit board 2, and which prevents the main unit of the electronic apparatus from being damaged in a collision of the vehicle. The interior of the case 1 is used as a space for housing the printed circuit board 2 and the like. The case 1 is formed so that a thin portion 18 (the second portion) in which the wall thickness is reduced is disposed in a predetermined distance (about 10 mm) from an opening of the case and the inner portion of the case 1 has thicker walls of a substantially uniform thickness (the first portion). Mounting faces 13 on which the printed circuit board 2 is to be mounted are formed in the four corners of the interior of the case 1, respectively. Screw holes 14 with which the printed circuit board 2 is to be screwed are formed in the mounting faces 13, respectively. A plurality of brackets 15 (in the embodiment, three) for attaching the vehicular electronic device to the frame 80 of the vehicle are extended from the outer face of the thin portion 18 of the case 1. Each of the brackets 15 has an abutting face 17 which is to abut against the frame 80 of the vehicle or the like, and an attachment hole 16 through which a bolt 85 is to be passed.

In the printed circuit board 2, the external shape has dimensions which allow the board to be housed in the space of the case 1, attachment holes 23 are formed respectively in the four corners at the same intervals as those of the screw holes 14 of the case 1, and copper patterns are formed on both the faces. The acceleration sensor 21 and the other electronic components 22 are mounted on the upper face (on the side of the top plate 5 of the case) of the printed circuit board 2.

The lid 3 is configured by a steel plate. In the lid, the external shape has dimensions which allow the lid to be housed in the space of the case 1, attachment holes 24 through which screws 86 are to be passed are formed respectively in the four corners at the same intervals as those of the screw holes 14 of the case 1. A rib 31 which is slightly raised is formed on the whole periphery of the lid 3. The lid exerts functions of dustproof and electromagnetic shielding on electronic circuits, and prevents the copper patterns and components from being damaged by an external force.

The connector 4 is an output terminal for electrically connecting the printed circuit board with the outside, for example, by transmitting an ignition command generated by the acceleration sensor 21 or the other electronic component 22 to a gas generator of an air bag. Flexible resin coated wires each having a predetermined slack length are connected to the output terminal.

Next, a deformation state of the vehicular electronic device due to a frontal collision of the vehicle will be described.

Figure 4:
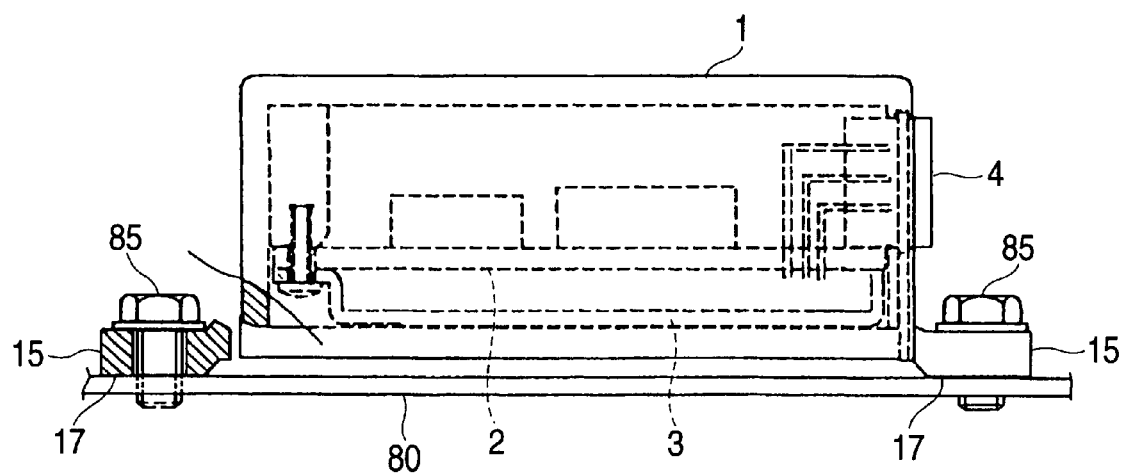
FIG. 4 is a view showing a state where the vehicular electronic device of the embodiment of the invention is broken by an impact load.

FIG. 4 is a view showing a state where the vehicular electronic device of the embodiment of the invention is broken by an impact load. The brackets 15 of the vehicular electronic device are fixed to the frame 80 by the bolts 85. When a collision of the vehicle occurs and the frame 80 is bent to increase the intervals of the brackets 15, deformation or breakage is caused in the thin portion 18 of the side walls 12. Since a step 18a of the thin portion 18 is closer to the brackets 15 than the space configured by the printed circuit board 2 and the case 1, the space configured by the printed circuit board 2 and the case 1 is not deformed, and hence broken pieces of the aluminum die casting are not produced in the space, so that the vehicular electronic device normally operates. Even when the case 1 is broken at the brackets 15 to be completely separated from the frame 80 of the vehicle, the wires are not broken because the wires are flexible and have a predetermined slack length, and transmit the ignition command to the air bag, so that the air bag surely operates.

In the above, the example in which the intervals of the brackets 15 are increased has been described. Also in the case where the brackets 15 are made closer to one another, the vehicular electronic device operates normally.

In the printed circuit board 2, the components may be mounted not only on the face on the side of the top plate 5, but also on that on the side of the lid 3.

Figure 5:
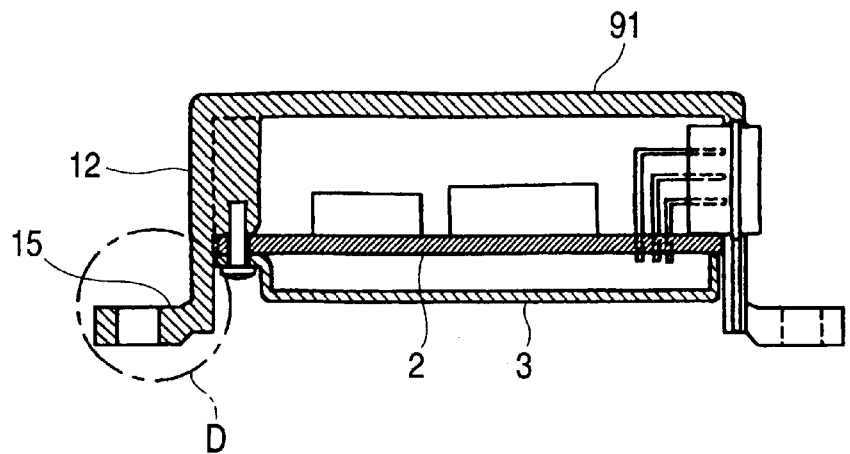
FIG. 5 shows modifications of the embodiment, (a) is a view showing a structure having a groove, and (b) is a view showing a structure in which through holes are opened.
Figure 5:
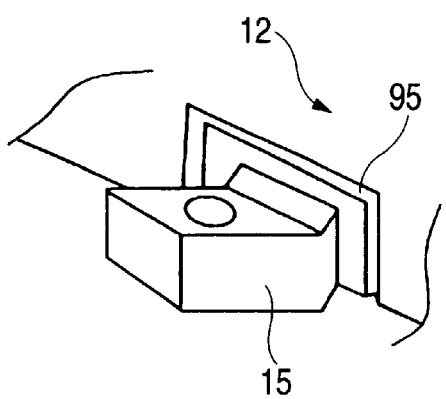
Figure 5:
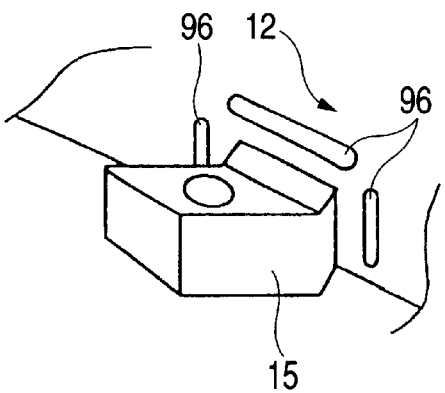
Figure 6:
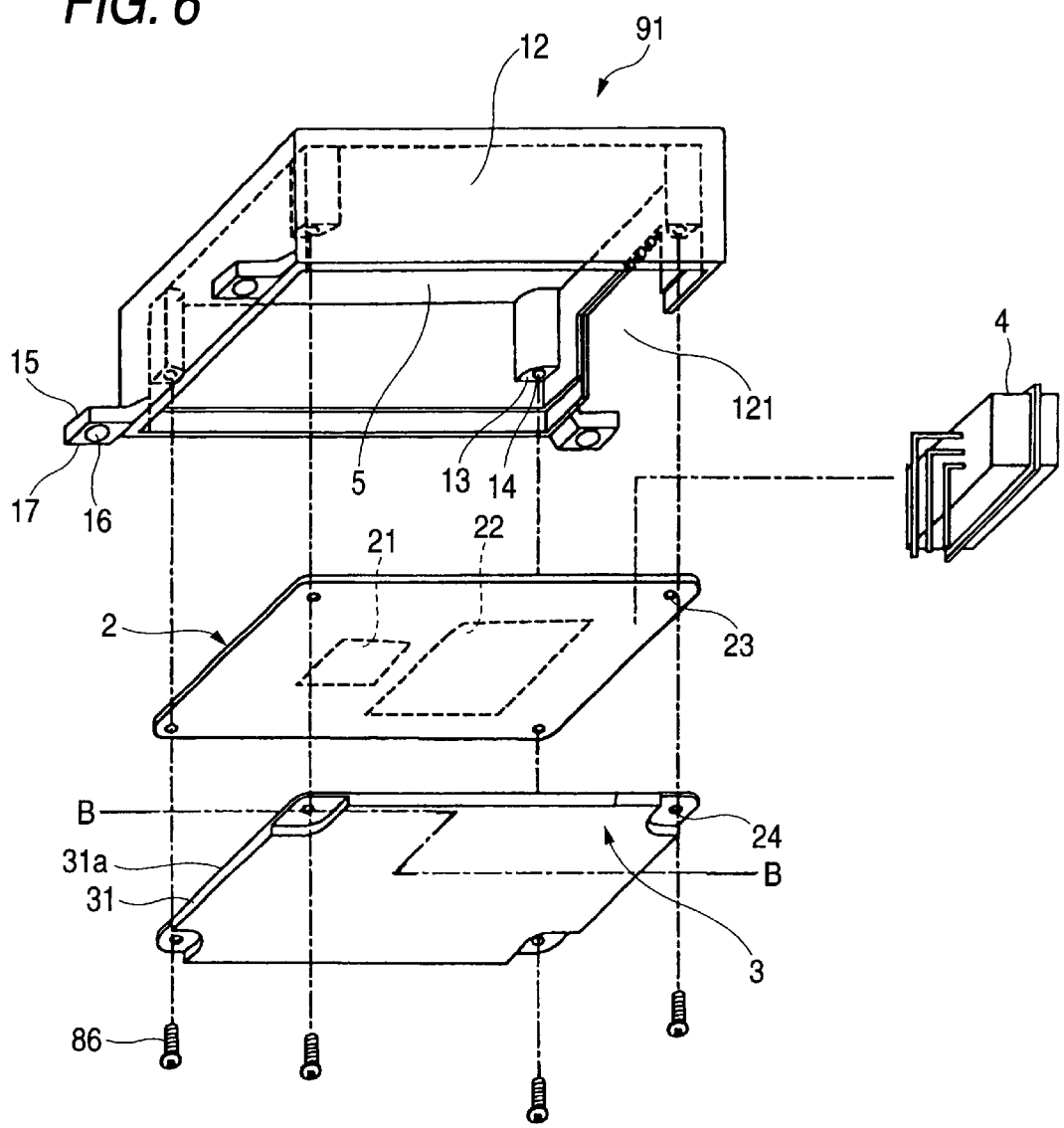
FIG. 6 is an exploded perspective view of a conventional vehicular electronic device.
Figure 7:
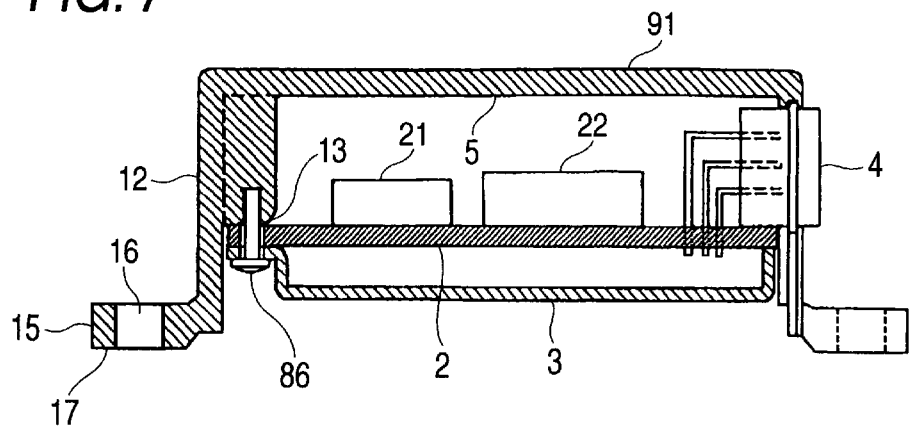
FIG. 7 is a section view of the conventional vehicular electronic device, taken along the line B—B of FIG. 6.
Figure 8:
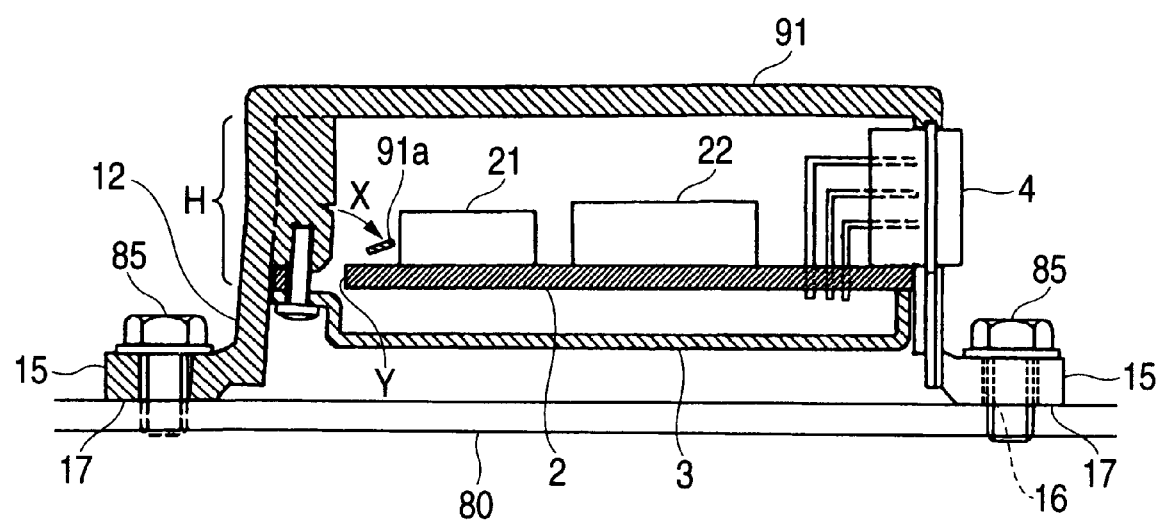
FIG. 8 is a view showing a state where the conventional vehicular electronic device is broken by an impact load.

In the embodiment, the brackets 15 are extended from the thin portion 18 of the case 1. Alternatively, the following structures may be employed as modifications. In a connecting portion (the portion D in FIG. 5) between the case 91 and each of the brackets 15, a groove 95 (second portion) may be formed (FIG. 5(a)), or through holes 96 (second portion) may be opened (FIG. 5(b)). The brackets 15 may be made of a material such as a synthetic resin, which is broken more easily than the material of the case 1, and may be coupled to the case by means of bonding or fitting.

The vehicular electronic device may be placed in various positions of a vehicle. When the embodiment is applied to an apparatus to be placed in the periphery of a vehicle, such as a front sensor, a particular effect can be attained.

In the embodiment, an aluminum die casting is used as the material of the case. Any material may be used as far as rigidity of a predetermined level or higher is attained under a normal state, and breakage such as rupture occurs when a strong impact is applied.

As described above, according to the invention, the main unit of a vehicular electronic device on which an acceleration sensor for an air bag, and the like are mounted can maintain its operation function even when a vehicle is deformed by a collision. Therefore, an operation which is to be conducted in response to a collision, such as expansion of an air bag can be surely conducted.

What is claimed is:

1. A vehicular electronic device, comprising:
   a circuit board for performing a predetermined control in a vehicle;
   a case for housing the circuit board;
   a connector for electrically connecting the circuit board with an outside; and
   a bracket formed integrally with the case, the bracket for attaching the case to the vehicle,
      wherein the case has a first portion and a second portion;
      wherein at least a part of the second portion is thinner than the first portion; and
      wherein the second portion is closer to the bracket than the first portion, and deformation or breakage of the second portion is promoted when collision of the vehicle occurs.

2. The vehicular electronic device according to claim 1, wherein the first portion defines space in which the circuit board is housed.

3. The vehicular electronic device according to claim 1, wherein when the case is attached to the vehicle, the first portion is thicker than the second portion in a longitudinal direction of the vehicle.

4. The vehicular electronic device according to claim 1, wherein the circuit board controls an air bag.

5. The vehicular electronic device according to claim 1, wherein the collision of the vehicle causes expansion of an air bag.

6. A vehicular electronic device, comprising:
   a circuit board for performing a predetermined control in a vehicle;
   a case for housing the circuit board;
   a connector for electrically connecting the circuit board with an outside; and
   a bracket formed integrally with the case, the bracket for attaching the case to the vehicle,
      wherein the case has a first portion and a second portion;
      wherein at least a part of the second portion is thinner than the first portion;
      wherein the second portion is closer to the bracket than the first portion;
      wherein the second portion defines has a groove formed to surround the bracket.

7. A vehicular electronic device, comprising:
   a circuit board for performing a predetermined control in a vehicle;
   a case for housing the circuit board;
   a connector for electrically connecting the circuit board with an outside; and
   a bracket formed integrally with the case, the bracket for attaching the case to the vehicle,
      wherein the case has a first portion and a second portion;
      wherein at least a part of the second portion is thinner than the first portion;
      wherein the second portion is closer to the bracket than the first portion; and
      wherein the second portion defines at least one of through hole.

* * * * *